United States Patent [19]

Nagamura et al.

[11] Patent Number: 6,071,376
[45] Date of Patent: Jun. 6, 2000

[54] METHOD AND APPARATUS FOR CLEANING PHOTOMASK

[75] Inventors: Yoshikazu Nagamura; Nobuyuki Yoshioka, both of Tokyo; Hozumi Usui, Saitama; Koji Yamanaka, Satama, all of Japan

[73] Assignees: Mitsubishi Denki Kabushiki Kaisha; M. Watanabe Co., Ltd.; Organo Corporation, all of Tokyo, Japan

[21] Appl. No.: 09/122,763

[22] Filed: Jul. 27, 1998

[30] Foreign Application Priority Data

Dec. 2, 1997 [JP] Japan .................................. 9-331797

[51] Int. Cl.[7] ...................................................... C23F 1/02
[52] U.S. Cl. ............................................. 156/345; 134/1.1
[58] Field of Search ............................. 156/345; 134/1.1, 134/1.3, 84; 118/719; 29/25.01

[56] References Cited

U.S. PATENT DOCUMENTS

| Re. 36,290 | 9/1999 | Clark et al. .............................. 29/25.01 |
| 4,576,677 | 3/1986 | Faul et al. ................................. 156/642 |
| 5,275,691 | 1/1994 | Fukuta et al. ............................. 156/642 |
| 5,858,106 | 1/1999 | Ohmi et al. ................................... 134/1 |
| 5,922,620 | 7/1999 | Shimomura et al. .................... 438/693 |

*Primary Examiner*—Thi Dang
*Assistant Examiner*—Luz Alejandro

[57] ABSTRACT

To provide a photomask cleaning method which brings about a high effect of removing residual sulfuric acid or foreign objects and can remove foreign objects effectively without fluctuating the transmission or other properties of the light-shielding layer (MoSiON film) in a phase shift photomask.

A method of cleaning a photomask which comprises a first step of cleaning the surface of a photomask used as a master in the photolithography step in the process for the production of semiconductor device with a hot mixture of sulfuric acid and hydrogen peroxide to decompose organic objects present thereon and remove metallic impurities, a second step of removing residual sulfuric acid from the surface of said photomask, a third step of removing foreign objects attached to the surface of said photomask, and a fourth step of drying said photomask which has finished with said first, second and third steps, characterized in that said second step involves the removal of residual sulfuric acid from the surface of said photomask with anodic water and said third step involves the removal of foreign objects with cathodic water.

4 Claims, 7 Drawing Sheets

ANODE:   $O_2 + 4H^+ + 4e^- \rightleftarrows 2H_2O$

CATHODE: $2H^+ + 2e^- \rightleftarrows H_2$

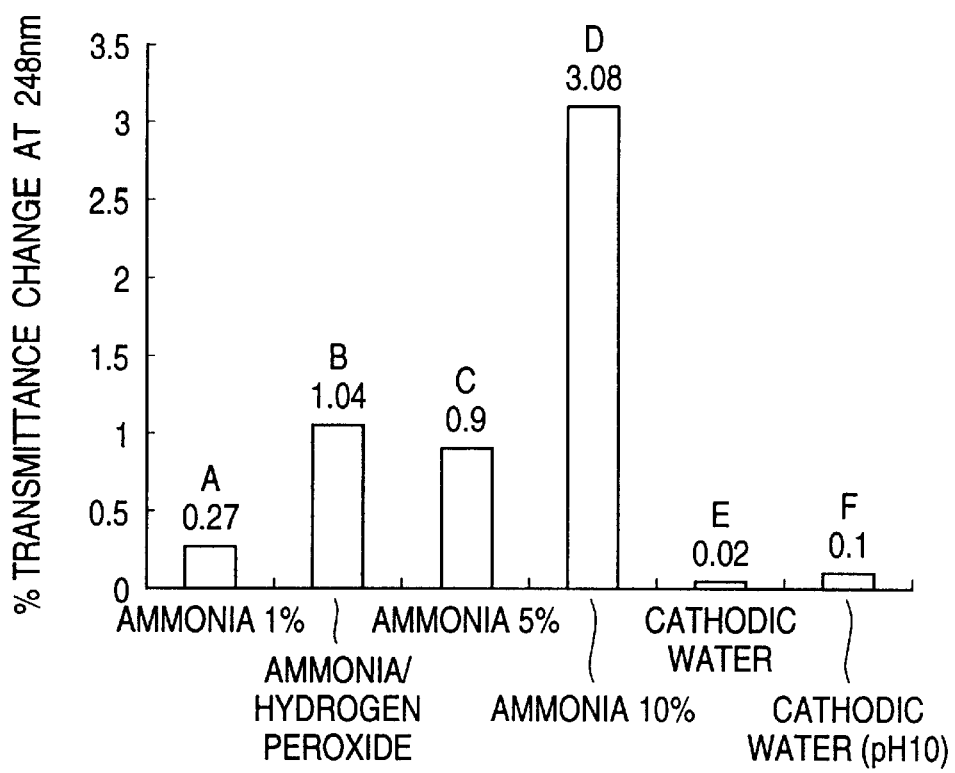
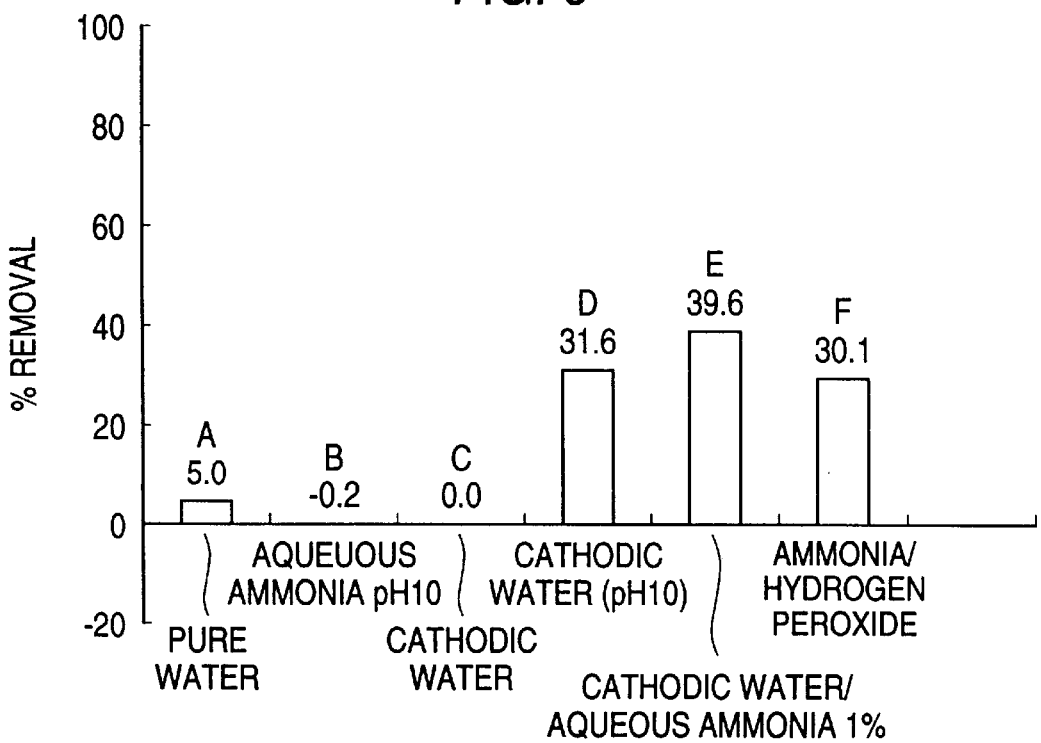

METHOD AND APPARATUS FOR CLEANING PHOTOMASK

Background of the Invention

1. Field of the Invention

The present invention relates to a method and apparatus for cleaning a photomask to be used as a master in the photolithography step in the process for the production of semiconductor integrated circuit device (LSI), where the photomask requires an extremely clean surface.

2. Description of the related Art

A photomask serves as a master when an integrated circuit pattern is transferred to the surface of a wafer by a transferring apparatus in the photolithograpy step in the process for the production of semiconductor integrated circuit device. If the pattern formed on the surface of the photomask has defects or foreign objects present thereon in an amount exceeding the critical resolution, they can be transferred to the wafer as a part of pattern.

Therefore, any defects or foreign objects beyond the critical resolution are not allowed to occur on the surface of the photomask.

With the development of integration density and precision of integrated circuit, the maximum allowable size of defects or foreign objects has been reduced to 0.5 $\mu$m.

The conventional method of cleaning a photomask has employed a cleaning method based on RCA cleaning (cleaning with a mixture of an acid such as sulfuric acid and hydrogen peroxide or a mixture of an alkaline agent such as aqueous ammonia and hydrogen peroxide), which is also widely used for cleaning wafers.

A flow chart of the cleaning process is shown in FIG. 11.

A conventional photomask cleaning step will be described in connection with FIG. 11.

Firstly, in the step 1, cleaning is effected with a hot mixture of sulfuric acid and hydrogen peroxide to decompose organic objects such as resist and residual solvent present on the surface of a photomask and remove metallic impurities.

This step provides the surface of the photomask with an improved wettability that enhances the efficiency of the subsequent cleaning steps.

Subsequently, in the step 2, the photomask is rinsed with hot pure water to remove residual agents such as sulfuric acid from the surface thereof.

Subsequently, in the step 3, the photomask is dipped in and cleaned with a heated mixture of ammonia and hydrogen peroxide for the purpose of removing attached foreign objects.

During this step, an ultrasonic wave such as a megasonic wave may be applied to the dipping tank to remove foreign objects more effectively.

This step, too, needs to be followed by rinsing with pure water as shown in the step 4.

Finally, the photomask which has been thus rinsed is dried in the step 5.

The step 3 may involve cleaning with pure water alone or mixed with a detergent under the application of an ultrasonic wave such as megasonic wave, rather than with the mixture of ammonia and hydrogen peroxide.

The dip cleaning method as mentioned above allows the simultaneous dipping of a plurality of photomasks to enhance the cleaning efficiency but has a disadvantage that extremely contaminated photomasks contaminate relatively clean photomasks.

In order to surmount this desadvantage, as a process involving the use of a cleaning fluid on a throwaway basis for every sheet of photomask there has been employed a cleaning process (spin process) which comprises spraying onto the surface of a photomask which is horizontally rotated a cleaning fluid such as chemical agent and pure water from a fixed or swinging nozzle so that the cleaning fluid is used on a throwaway basis every sheet of photomask.

The spin cleaning process may involve a mechanical cleaning such as high pressure jet pure water rinsing and megasonic pure water rinsing to effectively remove foreign objects.

The conventional cleaning process as shown in FIG. 11 is disadvantageous in that the treatment with sulfuric acid/hydrogen peroxide (step 1) is sometimes followed by insufficient cleaning possibly leaving some amount of sulfuric acid behind that causes fogging on the surface of the photomask.

Fogging on the surface of the photomask reduces the transmittance of the photomask on the unpatterned area (area which transmits light on the wafer), causing a variation of the dimension of a resist patternwise formed on the wafer. Particularly in the case of half tone photomask, since an exposure light penetrates slightly semitransparent pattern such as MoSiON film, fogging on the surface of the photomask reduces the transmittance of the photomask on the semitransparent pattern as well as the unpatterned area. As a result, resolution of the resist pattern formed on the wafer is lowered. This can break the wiring in integrated circuit (LSI), deteriorating the properties of LSI itself.

In the conventional cleaning process, the treatment with sulfuric acid/hydrogen peroxide (step 1) is followed by rinsing with a large amount of pure water or hot pure water (step 2) to prevent the remaining of sulfuric acid. However, this rinsing step consumes a large amount of pure water and considerable electric energy required to heat pure water.

In the dipping process for the treatment with ammonia/hydrogen peroxide for the purpose of removing foreign objects, a plurality of photomasks are treated with the same batch of cleaning fluid. Therefore, the cleaning fluid must be renewed so frequently to prevent the deterioration or contamination thereof, adding to the required amount thereof.

Further, if the cleaning efficiency (yield in cleaning) is poor, the number of cleaning times required per sheet of photomask increases. Therefore, the required amount of cleaning fluid, pure water and energy such as electric power increases.

In recent years, as shown in FIGS. 12A–12D a phase shift photomask which can improve a resist resolution on the wafer by partly changing the phase transmitted thereby has been developed and put into practical use. FIG. 12A represents Levenson type of phase shift photomask, FIG. 12B represents Sub Pattern type of phase shift photomask, FIG. 12C represents edge empathizing type of phase shift photomask, and FIG. 12D represents half tone type of phase shift photomask. Numeral 300 is a quartz substrate, 301 is a light shielding pattern such as a CrON film and 302 is a phase shifter such as a MoSiON film. 303 is an etching stopper.

An MoSiON film is a material used for light-shielding layer (semi transparent layer) in a halftone photomask, which is one of these phase shift photomasks. However, when subjected to conventional cleaning with alkali solution, e.g., involving dipping in ammonia/hydrogen peroxide, it shows a drastic change in transmittance or phase angle caused by increasing a surface roughness and thickness reduction. Particularly in the case of halftone photomask, since resolution of the resist pattern formed on the wafer depends on the change in transmittance or phase angle, such a change in transmittance or phase angle causes very serious problem. Therefore, it is not possible to maintain a desired product quality when shipped.

Accordingly, in practice, the cleaning with ammonia/hydrogen peroxide effective for the removal of foreign objects (step 3) cannot be effected for MoSiON film. Thus, MoSiON film has been cleaned with pure water alone or a detergent, causing the remaining of foreign objects.

SUMMARY OF THE INVENTION

The present invention has been worked out to overcome these disadvantages. An object of the present invention is to provide a method and apparatus for cleaning a photomask which allow the followings:

(1) To effectively remove residual agents (mainly sulfuric acid) from the surface of a photomask after cleaning step, improving the quality of photomask;
(2) To bring about the same or higher effect of removing foreign objects than the conventional cleaning process with a small amount of chemical cleaning fluid, reducing the required amount of cleaning fluid or pure water; and
(3) To provide effective removal of foreign objects without changing the transmittance and other properties of the light-shielding layer (MoSiON film) in the phase shift photomask.

A first aspect of the method is a method of cleaning a photomask, which comprises:

a first step of cleaning the surface of a photomask used as a master in the photolithography step in the process for the production of semiconductor device with a hot mixture of sulfuric acid and hydrogen peroxide to decompose organic objects present thereon and remove metallic impurities;

a second step of removing residual sulfuric acid from the surface of said photomask;

a third step of removing foreign objects attached to the surface of said photomask; and a fourth step of drying said photomask, wherein said second step involves the removal of residual sulfuric acid from the surface of said photomask with anodic water.

A second aspect of the method is a method of cleaning a photomask according to the first aspect, wherein said anodic water to be used in said second step is heated to a temperature of not lower than 30° C.

A third aspect of the method is a method of cleaning a photomask, which comprises:

a first step of cleaning the surface of a photomask used as a master in the photolithography step in the process for the production of semiconductor device with a hot mixture of sulfuric acid and hydrogen peroxide to decompose organic objects present thereon and remove metallic impurities;

a second step of removing residual sulfuric acid from the surface of said photomask;

a third step of removing foreign objects attached to the surface of said photomask; and a fourth step of drying said photomask, wherein said third step involves the removal of foreign objects with cathodic water.

A fourth aspect of the method is a method of cleaning a photomask according to the third aspect, wherein said cathodic water to be used in said third step contains a slight amount of ammonia.

A fifth aspect of the method is a method of cleaning a photomask according to the third aspect, wherein said second step involves the removal of residual sulfuric acid from the surface of said photomask with anodic water.

A sixth aspect of the method is a method of cleaning a photomask according to the fifth aspect, wherein said anodic water to be used in said second step is heated to a temperature of not lower than 30° C.

A seventh aspect of the method is a method of cleaning a photomask according to the first aspect, wherein at least one of said first to third steps involves ultrasonic treatment as well.

A eighth aspect of the method is a method of cleaning a photomask according to the first aspect, wherein said photomask to be cleaned is a quartz substrate on which light shielding film is formed.

A ninth aspect of the-method is a method of cleaning a photomask according to the first aspect, wherein said photomask to be cleaned is half tone mask of a quartz substrate on which semi transparent pattern as a phase shifter is formed.

A tenth aspect of the method is a method of cleaning a photomask according to the first aspect, wherein said photomask to be cleaned is half tone mask of a quartz substrate on which semi transparent pattern as a phase shifter and light shielding film of metal and metal compound are formed.

An eleventh aspect of the method is a method of cleaning a photomask according to the ninth aspect, wherein said phase shifter comprise a MoSiON film.

A twelfth aspect of the method is a method of cleaning a photomask according to the first aspect, wherein said photomask to be cleaned is a quartz substrate on which light shielding film of metal and metal compound are formed.

A thirteenth aspect of the method is a method of cleaning a photomask according to the eighth aspect, wherein said light shielding film comprise a CrON film.

A fourteenth aspect of the method is a method of cleaning a photomask according to the first aspect, wherein said photomask to be cleaned is a photomask performed laser trimming after formation.

A fifteenth aspect of the method is a method of cleaning a photomask according to the fourth aspect, wherein said cathodic water to be used in said third-step is a solution which has a concentration of an ammonia not more than 1%.

A sixteenth aspect of the method is a method of cleaning a photomask according to the fifteenth aspect, wherein said cathodic water to be used in said third step is a solution which has a concentration of an ammonia not more than 0.003%.

A seventeenth aspect of the apparatus is an apparatus for cleaning a photomask which comprises:

an acid tank for cleaning the surface of a photomask used as a master in the photolithography step in the process for the production of semiconductor device with a hot mixture of sulfuric acid and hydrogen peroxide to decompose organic objects present thereon and remove metallic impurities; electrolytic water production unit;

a rinsing tank for cleaning the surface of said photomask with anodic water produced in the electrolytic water production unit;

a foreign object removal tank for cleaning the surface of said photomask with cathodic water produced in said electrolytic water production unit;

a drying tank for drying said photomask thus cleaned; and a cleaning fluid supplying/controlling means for controlling the respective cleaning fluid to be supplied into said acid tank, rinsing tank and foreign object removal tank within a predetermined concentration or temperature.

A eighteenth aspect of the apparatus is an apparatus for cleaning a photomask according to seventeenth aspect, wherein at least one of said acid tank, rinsing tank and foreign object removal tank is capable of ultrasonic treatment as well.

A nineteenth aspect of the apparatus is an apparatus for cleaning a photomask according to seventeenth aspect, wherein said anodic water to be used in said rinsing tank is heated to a temperature of not lower than 30° C.

A twentieth aspect of the apparatus is an apparatus for cleaning a photomask according to seventeenth aspect, wherein a means of supplying an aqueous ammonia with a predetermined concentration into said foreign object removal tank is provided and said cathodic water to be used in said foreign object removal tank contains a slight amount of ammonia.

BRIEF DESCRIPTION OF THE DRAWINGS

FIG. 5 is a graph illustrating the change of transmittance of MoSiON film treated with various cleaning fluids according to Embodiment 3 of the present invention after alkali treatment;

FIG. 6 is a graph illustrating the percent removal of particulate alumina on MoSiON film treated with various cleaning fluids according to the third Embodiment of the present invention;

DESCRIPTION OF THE PREFERRED EMBODIMENTS

Embodiment 1

In Embodiment 1 of the present invention, a process for the removal of residual sulfate ions from the surface of a photomask which has been subjected to treatment with sulfuric acid/hydrogen peroxide will be described.

Figure 1:
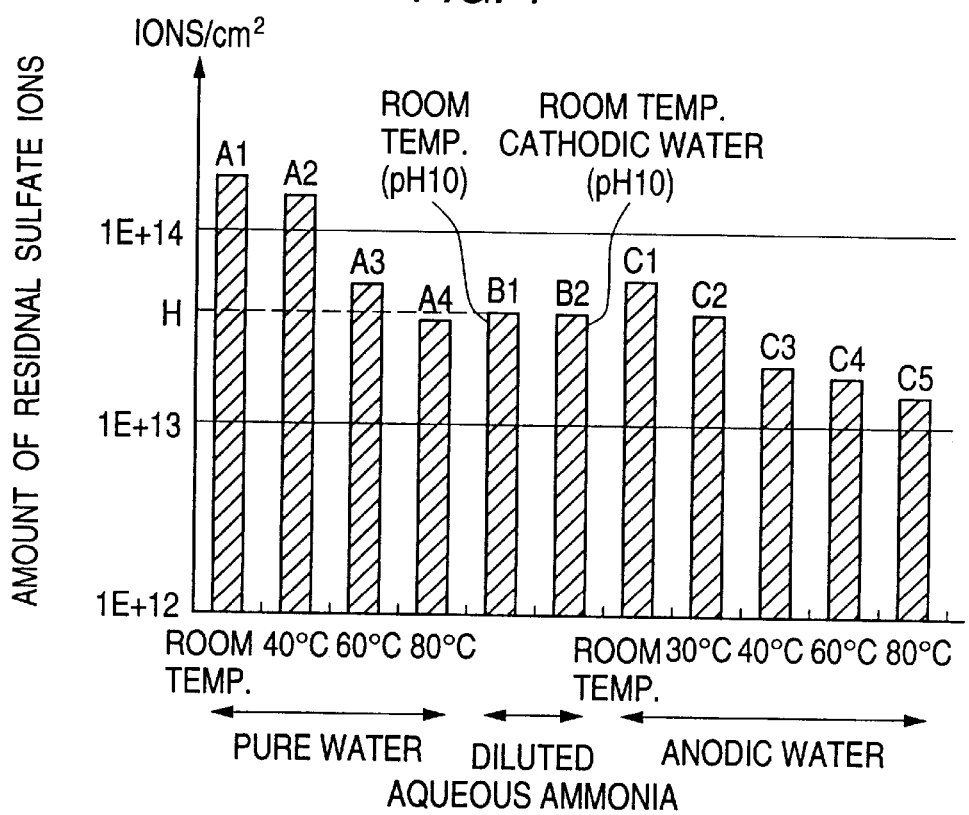
FIG. 1 is a diagram illustrating the amount of residual sulfate ions after rinsing with various cleaning fluids according to the first Embodiment of the present invention.

FIG. 1 illustrates the results of ion chromatography for analysis of the amount of sulfate ions left on a glass substrate for photomask, having a size of 5 inch square and a thickness of about 2 mm and on which light shielding pattern is formed, which has been dipped in sulfuric acid, and then dipped in various rinsing fluids (pure water, diluted aqueous ammonia, anodic water) in an overflow bath for rinsing.

As shown in FIG. 1, as rinsing fluids there were used the followings:

A1: pure water of room temperature (25° C.);

A2: pure water of 40° C.;

A3: pure water of 60° C.;

A4: pure water of 80° C.;

B1: diluted aqueous ammonia of room temperature having a hydrogen ion concentration (pH) of 10;

B2: cathodic water of room temperature having a hydrogen ion concentration (pH) of about 10 obtained by adding a slight amount of aqueous ammonia;

C1: anodic water of room temperature (25° C.)

C2: anodic water of 30° C.:

C3: anodic water of 40° C.;

C4: anodic water of 60° C.; and

C5: anodic water of 80° C.

The term "anodic water" as used herein is meant to indicate electrolytic water having oxygen dissolved therein to almost saturation and produced in an anodic bath by the electrolysis of pure water. The term "cathodic water" as used herein is meant to indicate electrolytic water having hydrogen dissolved therein to almost saturation and produced in a cathodic bath. The process for the production of anodic water and cathodic water will be described later.

In FIG. 1, the ordinate indicates the amount of residual sulfate ion (unit: ion/cm$^2$). As can be seen in the graph, in the rinsing with pure water alone (A1–A4), the amount of residual sulfate ion decreases as the temperature of pure water used rises from room temperature (25° C.) to 80° C.

The glass substrate which had been rinsed similarly with diluted aqueous ammonia of pH 10 (B1) showed a less amount of residual sulfate ions than those rinsed with pure water of room temperature and 60° C. (A3).

A glass substrate having a CrON film (one of ordinary light-shielding layers which is not adapted for phase shift photomask) formed as a light-shielding layer on one side thereof was examined for the occurrence of fogging on the surface thereof due to difference in rinsing process after treatment with sulfuric acid. As a result, it was confirmed that mere rinsing with pure water of room temperature (25° C.) causes fogging as early as in one day after cleaning.

Photomask blanks which had been rinsed with pure water of 60° C. showed no fogging in one day after cleaning but showed light fogging after about one month.

On the other hand, a photomask substrate which had been rinsed with diluted aqueous ammonia showed no fogging even after about one month.

It can be presumed from these results that if the amount of sulfuric acid left on the surface of a photomask substrate which has been rinsed after treatment with sulfuric acid is on the level of the residual amount of sulfate ions attained with diluted aqueous ammonia (indicated by H in FIG. 1), no fogging occurs on the photomask.

However, as can be seen in FIG. 1, if pure water alone is used, it needs to be heated to a temperature of at lowest about 60° C., preferably about 80° C.

Further, as shown in FIG. 1, if rinsing is effected in the same manner as above with anodic water (C1) of room temperature (25° C.) produced by the electrolysis of pure water, sulfuric acid can be removed to the same level as with rinsing with pure water of about 60° C. (A3).

It was also found that if rinsing is effected with anodic water of 30° C. (C1), residual sulfuric acid can be removed to almost the same level (level indicated by H in FIG. 1) as with rinsing with pure water of about 80° C. (A4).

Further, rinsing with anodic water heated to a temperature of not lower than 30° C. (C2–C5) makes it possible to remove residual sulfate ions more effectively.

Thus, the use of anodic water makes it possible to remove residual sulfate ions more effectively.

In other words, a sufficient effect of removing sulfuric acid can be brought about with anodic water at a lower temperature than with pure water alone, eliminating the necessity of heating to temperature as high as for pure water and hence making it possible to reduce the required amount of electric power.

Further, the change of cleaning fluid from pure water to anodic water improves the removing effect, making it possible to reduce the rinsing time and the required amount of pure water.

As mentioned above, in the present embodiment, rinsing with anodic water for the purpose of removing residual sulfate ions after treatment with sulfuric acid/hydrogen peroxide makes it possible to effectively remove residual sulfate ions from the surface of the photomask even if the anodic water is warmed to a temperature as low as about 30° C.

Thus, the resulting enhancement of percent removal of residual sulfate ions makes it possible to reduce the required processing time as well as the required amount of pure water or the consumed amount of electric energy.

The term "anodic water" as used herein is meant to indicate electrolytic water having oxygen dissolved therein to almost saturation produced in an anodic bath by the electrolysis of pure water. The term "cathodic water" as used herein is meant to indicate electrolytic water having hydrogen dissolved therein to almost saturation produced in a cathodic bath. An example of the apparatus for producing such electrolytic water and its production mechanism will be described in connection with FIG. 2.

Figure 2:
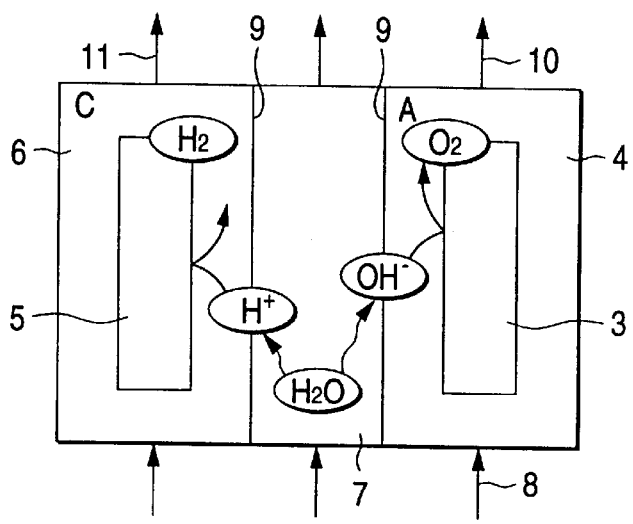
FIG. 2 is a diagram illustrating an apparatus and process for the production of electrolytic water.

In FIG. 2, the reference numeral 3 indicates an anode, the reference numeral 4 indicates an anode bath, the reference numeral 5 indicates a cathode, the reference numeral 6 indicates a cathode bath, the reference numeral 7 indicates an intermediate bath, the reference numeral 8 indicates an inlet pipe through which pure water is introduced into the anode bath 4, the reference numeral 9 indicates an ion-exchange membrane, the reference numeral 10 indicates anodic water produced in the anode bath 4, and the reference numeral 11 indicates cathodic water produced in the cathode bath 6.

The chemical reaction formulae shown in FIG. 2 indicate the electrolysis of pure water at the anode 3 and the cathode 5, respectively.

As shown in FIG. 2, the apparatus for the production of electrolytic water consists of three baths, i.e., an anode bath 4 having an anode 3 provided therein, a cathode bath 6 having a cathode 5 provided therein and an intermediate bath 7 filled with an ion-exchange resin.

The intermediate bath 7 and the anode bath 4, and the intermediate bath 7 and the cathode bath 6 are partitioned by the ion-exchange membrane 9.

In operation, a plus potential and a minus potential are applied to the anode 3 and the cathode 5, respectively, while pure water is being supplied into the electrolytic bath through the inlet pipe 8. As a result, $H^+$ and $OH^-$ bonded to exchange group in the ion-exchange resin undergo repeatedly dissociation from and bonding to adjacent exchange group to migrate towards the electric field. Eventually, these ions reach the surface of electrodes where they undergo redox reaction which produces oxygen molecule ($O_2$) at the anode 3 and hydrogen molecule ($H_2$) at the cathode 5. These molecules are then dissolved in the respective pure water.

The exchange groups of which $H^+$ and $OH^-$ have been took off undergo new ion bonding to $H^+$ and $OH^-$ which are produced by the continuous dissociation of pure water.

The electrolysis of pure water in this manner makes it possible to produce anodic water 10 having oxygen dissolved therein to almost saturation from the anode bath 4 and cathodic water 11 having hydrogen dissolved therein to almost saturation from the cathode bath 6.

In some case, electrolytic water production apparatus consisting of two baths, i.e., an anode bath 4 and a cathode bath 6 partitioned by an ion-exchange membrane 9 without any intermediate bath 7 may be used.

Embodiment 2

In Embodiment 2, a process for the effective removal of foreign objects such as fine dust and particulate metal or organic materials which has been adhering to the surface of a photomask (particularly, the surface of a light-shielding layer) during the production process will be described.

In general, this step is effected after the step of removing sulfate ions left on the surface of the photomask which has been treated with sulfuric acid/hydrogen peroxide as described in Embodiment 1.

Figure 3:
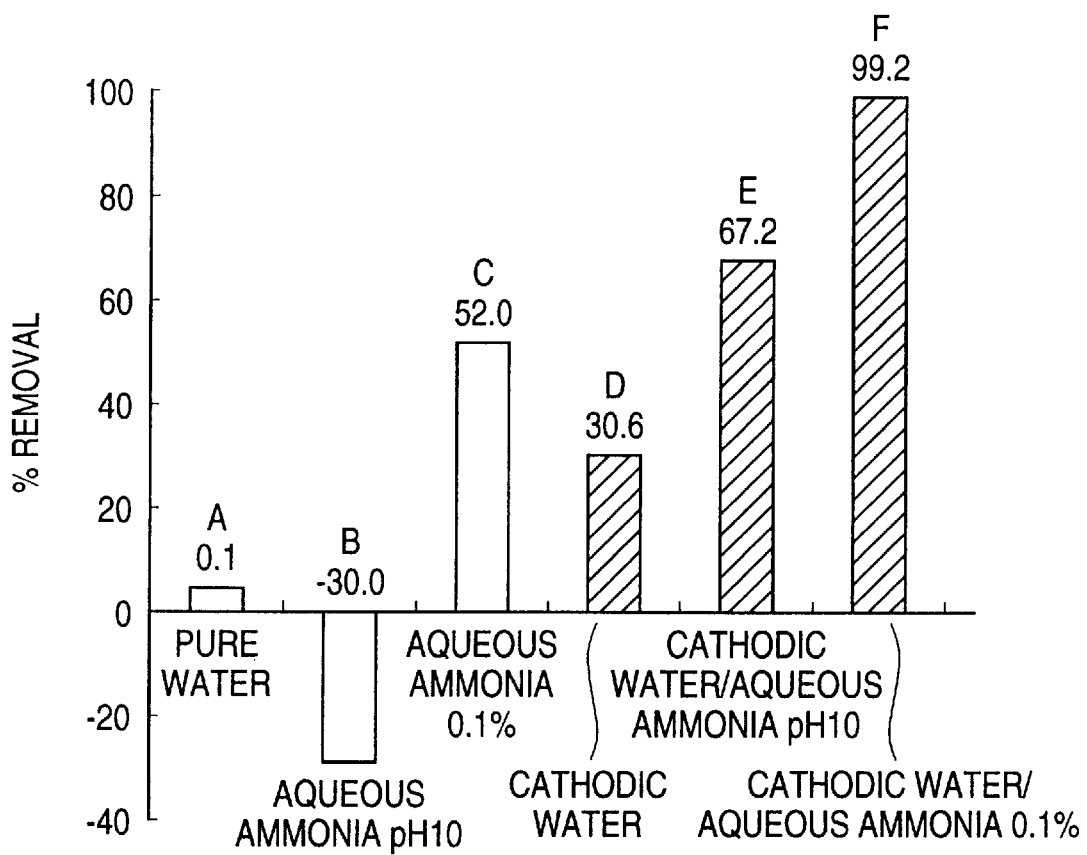
FIG. 3 is a diagram illustrating the percent removal of foreign objects (particulate silica) from CrON film with various cleaning fluids according to the second Embodiment of the present invention.
Figure 4:
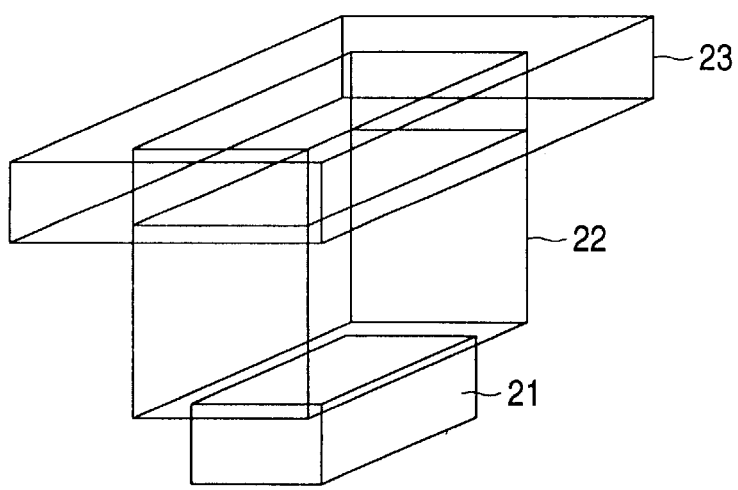
FIG. 4 is a diagram illustrating an overflow bath provided with an ultrasonic oscillator.

FIG. 3 illustrates the percent removal of particulate silica determined when a photomask having a CrON film formed thereon as a light-shielding layer was contaminated with particulate silica ($SiO_2$) as an impurity on the surface thereof, and then dipped in various cleaning fluids in a quartz overflow bath equipped with an ultrasonic oscillator as shown in FIG. 4 so that the photomask was subjected to megasonic treatment.

In FIG. 4, the reference numeral 21 indicates an ultrasonic oscillator, the reference numeral 22 indicates an inner bath in overflow bath, and the reference numeral 23 indicates an outer bath in overflow bath.

As shown in FIG. 3, the experiment was effected with the following cleaning fluids:

A: pure water;

B: diluted aqueous ammonia (pH 10);

C: aqueous ammonia having a concentration of 0.1%;

D: cathodic water;

E: cathodic water having pH of about 10 obtained by adding a slight amount of ammonia; and F: cathodic water comprising 0.1% of ammonia incorporated therein The percent removal of impurities(particulate silica) was determined for each of these cleaning fluids.

The percent removal of impurities was determined by dividing the number of particles removed by ultrasonic treatment by the number of particles present before the treatment.

As can be seen in FIG. 3, the treatment with pure water (A) and with diluted aqueous ammonia having pH10 (B) gave a percent removal of 0.1% and −30%, respectively. Thus, the particulate silica which had been attached to the light-shielding photomasuk as an impurity was little removed.

However, the treatment with cathodic water (D) produced by the electrolysis of pure water gave a percent removal of 30.6%.

Further, the treatment with cathodic water (E) produced by the electrolysis of pure water having a hydrogen ion concentration (pH) of about 10 obtained by the addition of an extremely slight amount of aqueous ammonia gave a percent removal rise to 67.2%.

The treatment with cathode water (F) comprising 0.1% of ammonia incorporated therein gave a percent removal as high as 99.2% while the treatment only with an aqueous ammonia (C) having a concentration of 0.1% gave a percent removal of 52.0%.

Thus, the megasonic treatment with cathodic water in this manner makes it possible to effectively remove foreign particulate objects(silica) from the surface of a photomask.

It was also found that the use of cathodic water comprising a slight amount of ammonia incorporated therein makes it possible to provide a marked improvement in the percent removal of foreign particulate objects from the surface of a photomask.

The concentration of ammonia used was about 0.003% to give a cleaning fluid having a pH value of 10. Thus, the cleaning effect can be enhanced even with an extremely low concentration of ammonia, making it possible to significantly reduce the required amount of cleaning fluid as compared with the conventional cleaning processes.

The amount of pure water to be used for the subsequent rinsing steps can be materially reduced as compared with the use of concentrated cleaning fluid.

Further, the resulting enhancement of cleaning capacity makes it possible to reduce the cleaning time required for removal of foreign objects and hence save energy such as electric power.

Embodiment 3

In Embodiment 3 of the present invention, a cleaning process suitable for the removal of foreign objects from a phase shift photomask such as halftone photomask will be described.

FIG. 5 illustrates the change of transmittance of an MoSiON film as a light-shielding layer(semi transparent film) in halftone photomask with treatment after an alkaline cleaning fluid.

A glass substrate having an MoSiON film formed thereon to a thickness of about 0.1 μm was dipped in various cleaning fluids for 2 hours, and then examined for change (%) of transmittance at a wavelength of 248 nm.

As shown in FIG. 5, the experiment was effected using as cleaning fluids the followings:

A: aqueous ammonia having a concentration of 1%;
B: ammonia/hydrogen peroxide;
C: aqueous ammonia having a concentration of 5%;
D: aqueous ammonia having a concentration of 10%;
E: cathodic water;
F: cathodic water added with a slight amount of ammonia (pH 10)

As a result, the treatment with ammonia/hydrogen peroxide (B), which has been heretofore used for the purpose of removing foreign objects in the conventional method of cleaning a photomask, gave a transmittance rise of 1.04%.

The treatment with pure water having an ammonia concentration of 5% (C) and pure water having an ammonia concentration of 1% (A) gave a transmittance rise of 0.9% and 0.27%, respectively.

However, the treatment with cathodic water (E) produced by the electrolysis of pure water and cathodic water (F) having a pH value of 10 obtained by adding a slight amount of ammonia gave a transmittance rise as small as 0.02% and 0.1%, respectively.

If the transmission rate of the MoSiON film formed as a light-shielding layer(semi transparent layer) on the surface of a photomask fluctuates, the shape and dimension of a resist obtained by transferring a circuit pattern onto a wafer is liable to variation that in turn deteriorates the properties of LSI. Therefore, the transmittance of the MoSiON film is strictly controlled.

The conventional treatment with ammonia/hydrogen peroxide (B) gives a great variation of transmittance and thus cannot be used to clean a photomask comprising an MOSiON film formed thereon. The variation of transmission as given by cathodic water (E) or cathodic water added with a slight amount of ammonia (pH10)(F)is tolerable.

And a surface roughness of the photomask before and after each treatment was measured by the AFM (Atomic Force Microscope).

The measured values of roughness was as follows.

TABLE

|  | RMS rough (Å) |
| --- | --- |
| Before treatment | 14.6 |
| After the treatment with cathodic water (E) | 11.9 |
| After the treatment with ammonia/hydrogen peroxide (B) | 18.4 |

As shown in the table, roughness of the photomask was improved by the treatment with cathodic water. Contrary that, roughness of the photomask was deteriorated by the treatment with ammonia/hydrogen peroxide.

By the step of cleaning a surface of the half tone photomask by using cathodic water, very smooth and flat surface was obtained.

FIG. 6 illustrates the percent removal of particulate alumina determined when an MoSiON film having particulate alumina ($Al_2O_3$) attached thereto was subjected to megasonic treatment in various cleaning fluids.

The percent removal was determined by dividing the number of particles removed by megasonic treatment by the number of particles present before the treatment.

As shown in FIG. 6, the experiment was effected with the following cleaning fluids:

A: pure water;
B: diluted aqueous ammonia having a pH value of 10;
C: cathodic water;
D: cathodic water having a pH value of 10 obtained by adding a slight amount of ammonia;
E: cathodic water having an ammonia concentration of 1%; and
F: ammonia/hydrogen peroxide As a result, the treatment with pure water (A), diluted aqueous ammonia (B) and cathodic water (C) gave a percent removal as small as 5.0%, −0.2% and 0.0%, respectively. The particulate alumina added as an impurity could be little removed.

On the other hand, the treatment with cathodic water (D) added with a slight amount of ammonia gave a percent removal of 31.6%.

Further, the treatment with cathodic water having an ammonia concentration of 1% obtained by increasing the added amount of ammonia(E) gave a percent removal of 39.6%.

The treatment with ammonia/hydrogen peroxide (F), which has heretofore been effectively used to remove foreign objects, gave a percent removal of 30.1%. It was thus found that the use of cathodic water (D) comprising a slight amount of ammonia incorporated therein can bring about the same effect of removing foreign objects as with ammonia/hydrogen peroxide (F), which has heretofore been used.

Accordingly, the results shown in FIGS. 5 and 6 show that if cathodic water comprising ammonia in a concentration as slight as 0.003% is used to remove foreign objects, the same or higher cleaning effect than ever can be brought about without fluctuating the transmittance of MoSiON film.

Further, when the ammonia concentration is not more than 1%, the restriction of cleaning process within a short period of time makes it possible to control the transmittance variation to not more than the control level (e.g., 0.5%) and enhance the cleaning effect.

In accordance with Embodiments 1 to 3 of the present invention, when heated, cleaning fluids such as cathodic water and cathodic water added with a slight amount of aqueous ammonia can bring about an enhanced cleaning effect.

In accordance with Embodiments 1 to 3 of the present invention, the cleaning process in an overflow bath as shown in FIG. 4 under the application of ultrasonic wave can bring about an even greater cleaning effect.

In accordance with Embodiment 2 or 3 of the present invention, the treatment with a weakly alkaline cleaning fluid obtained by adding to cathodic water a slight amount of an electrolyte such as KOH instead of ammonia can bring about a similar cleaning effect.

Embodiment 4

In Embodiment 4 of the present invention, the entire process for cleaning a photomask will be described.

Figure 7:
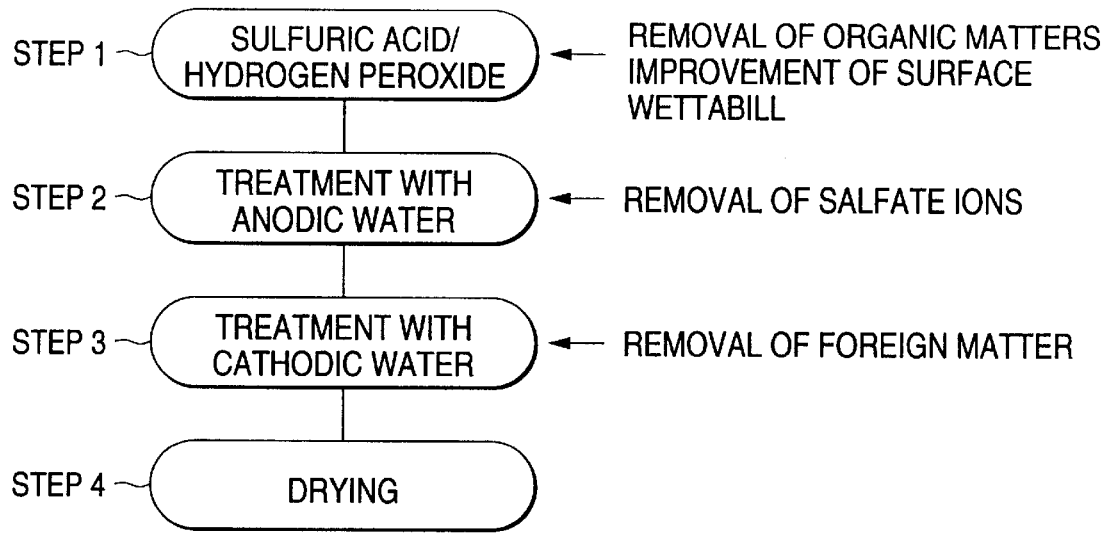
FIG. 7 is a diagram illustrating the entire steps of a process for cleaning a photomask according to the fourth Embodiment of the present invention.

FIG. 7 is a diagram illustrating the entire flow of a high performance cleaning process according to the present invention. Firstly, at the step 1, cleaning with a hot mixture of sulfuric acid and hydrogen peroxide is effected to decompose organic objects such as resist and solvent present on the surface of the photomask, improve the surface wettability of the photomask and remove metallic impurities.

Subsequently, at the step 2, cleaning is effected to remove residual cleaning fluid such as sulfuric acid from the surface of the photomask.

More specifically, cleaning is effected with anodic water as shown in Embodiment 1 of the present invention.

Even when warmed to a temperature as low as about 30° C., anodic water is capable of removing residual sulfuric acid to the same or higher extent when compared with hot pure water, making it possible to reduce the treatment time as well as the required amount of pure water or the consumption of electric energy for heating.

Subsequently, at the step 3, a treatment for the removal of foreign objects attached to the photomask is effected.

More specifically, if the light-shielding layer formed on the photomask to be cleaned is a CrON film, megasonic treatment with cathodic water or cathodic water added with a slight amount of ammonia makes it possible to effectively remove foreign particulate objects from the surface of the photomask as mentioned in Embodiment 2 of the present invention.

The concentration of ammonia used is about 0.003% to give a cleaning fluid having a pH value of 10. Thus, the cleaning effect can be enhanced even with an extremely low concentration of ammonia, making it possible to significantly reduce the required amount of cleaning fluid as compared with the conventional cleaning processes.

The amount of pure water to be used for the subsequent rinsing steps can be materially reduced as compared with the use of concentrated cleaning fluids.

Further, the resulting enhancement of cleaning capacity makes it possible to reduce the cleaning time required for removal of foreign objects and hence save energy such as electric power.

Further, if the photomask to be cleaned is a halftone mask and the light-shielding layer formed thereon is an MoSiON film, the step 3 involves a treatment for the removal of foreign objects with cathodic water added with ammonia to a concentration as slight as 0.003% as mentioned in Embodiment 3 of the present invention.

The treatment with such a cleaning fluid makes it possible to bring about the same or higher cleaning effect as compared with the conventional cleaning method, without fluctuating the transmittance of the MoSiON film.

Further, when the ammonia concentration is not more than 1%, restricting the cleaning process within a short period of time makes it possible to control the transmittance variation to not more than the control level (e.g., 0.5%) and enhance the cleaning effect.

It goes without saying that the foregoing cleaning steps can be effected more effectively if combined with megasonic treatment.

Subsequently, at the step 4, the photomask thus cleaned is dried to finish the cleaning process.

As mentioned above, the use of such a cleaning process provides enhancement in percent removal of residual sulfuric acid or attached foreign objects as compared with the conventional treatment, making it possible to reduce the treatment time as well as the required amount of pure water or electric energy. Further, the amount of cleaning fluid required for cleaning can be significantly reduced.

Further, even if the light-shielding layer is an MoSiON film, an effective cleaning can be effected without fluctuating the transmittance of the light-shielding layer.

Embodiment 5

In Embodiment 5 of the present invention, a cleaning apparatus for applying the photomask cleaning methods according to Embodiments 1 to 4 of the present invention will be described.

Figure 8:
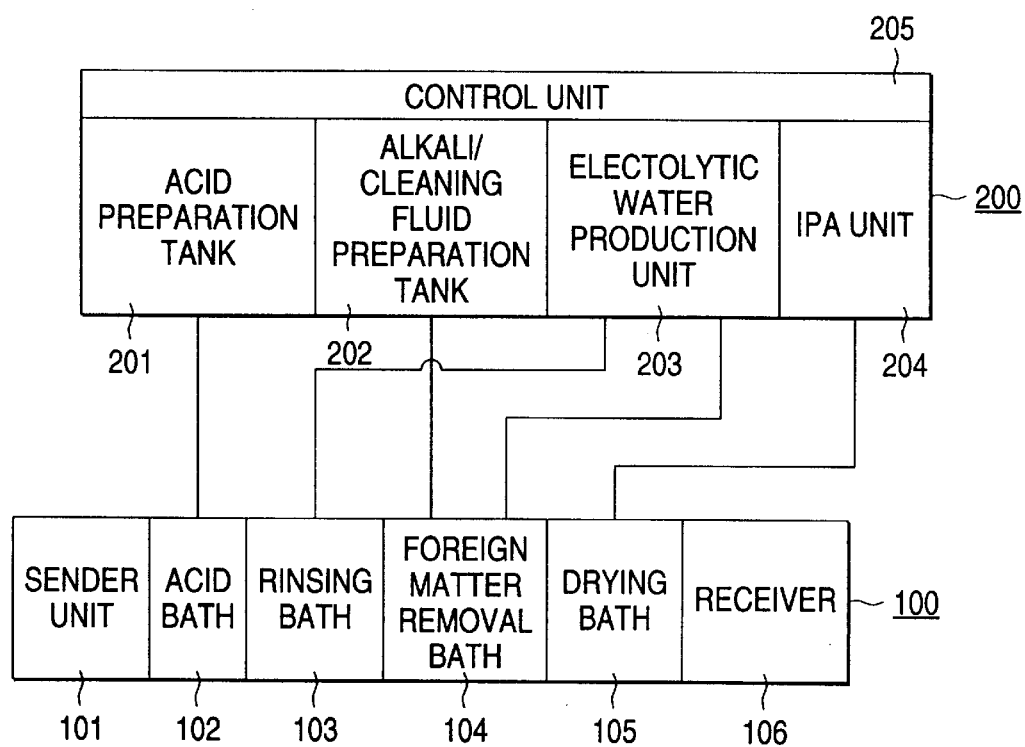
FIG. 8 is a diagram illustrating the structure of the photomask cleaning apparatus according to the fifth Embodiment of the present invention.

FIG. 8 is a diagram illustrating the structure of a high performance photomask cleaning apparatus according to the present embodiment.

In FIG. 8, the reference numeral 100 indicates a main body, and the reference numeral 200 indicates a cleaning fluid supply/control portion for controlling a cleaning fluid, pure water or the like to be supplied into various baths provided in the main body 100 to a predetermined concentration and temperature.

As shown in FIG. 8, the main body 100 of the cleaning apparatus comprises a sender unit 101, an acid bath 102, a rinsing bath 103, a foreign object removal bath 104, a drying bath 105, and a receiver 106.

The cleaning fluid supply/control portion 200 comprises an acid preparation tank 201, an alkali/cleaning fluid preparation tank 202, electrolytic water production unit 203, IPA (isopropyl alcohol) unit 204, and a control unit 205.

The operation of the cleaning apparatus will be described hereinafter in connection with FIG. 8.

Photomasks are charged into the sender unit 101 of the main body 100. During this procedure, a plurality of photomasks are charged one by one or at the same time.

The photomask thus charged into the sender unit 101 is sent into the acid bath 102 where it is then subjected to acid treatment with sulfuric acid/hydrogen peroxide or the like supplied from the acid preparation tank 201.

The photomask which has been treated in the acid bath 102 is sent into the rinsing bath 103 where it is treated with anodic water used to remove sulfate ions from the surface of the photomask substrate to an extent such that no fogging occurs on the photomask substrate.

The anodic water to be used at this step is supplied from the electrolytic water production unit 203. As mentioned in Embodiment 1 of the present invention, when warmed to a temperature of not lower than about 30° C., the anodic water allows effective cleaning such that the amount of sulfuric acid left after the acid treatment with sulfuric acid/hydrogen peroxide or the like falls below the acceptable level.

Accordingly, the control unit 205 of the control portion 200 controls such that the anodic water produced in the electrolytic water production unit 203 is heated to a temperature of about 30° C.

Rinsing with this anodic water makes it possible to remove residual sulfate ions more effectively.

The photomask which has been treated in the rinsing bath 103 is then sent into the foreign object removal bath 104.

The foreign object removal bath 104 is structured in such an arrangement that it is supplied with cathodic water produced in the electrolytic water production unit 203 and an aqueous ammonia which has been given a predetermined concentration in the alkali/cleaning fluid preparation tank, both under the control of the control unit 205.

As mentioned in Embodiment 3 of the present invention, the foreign object removal bath 104 performs megasonic treatment with cathodic water that makes it possible to remove foreign particulate objects from the surface of the photomask.

Further, the use of cathodic water added with a slight amount of ammonia provides significant enhancement of percent removal of foreign particulate objects from the surface of the photomask.

The concentration of ammonia used is about 0.003% to give a cleaning fluid having a pH value of 10. Thus, the cleaning effect can be enhanced even with an extremely low concentration of ammonia, making it possible to materially reduce the required amount of cleaning fluid.

The amount of pure water to be used for the subsequent rinsing steps can be significantly reduced as compared with the use of concentrated cleaning fluid.

Further, the resulting enhancement of cleaning capacity makes it possible to reduce the cleaning time required for removal of foreign objects and hence save energy such as electric power.

The acid bath 102, the rinsing bath 103 and the foreign object removal bath 104 can be configured to have an overflow bath structure as shown in FIG. 4 to perform ultrasonic treatment as well that allows further improvement in the cleaning effect. Further, in this arrangement, the cleaning fluid can be recycled and filtered in an overflow process in the various baths to save the required amount of pure water or cleaning fluid and control the amount of foreign objects in the cleaning fluid to a low level.

Figure 9:
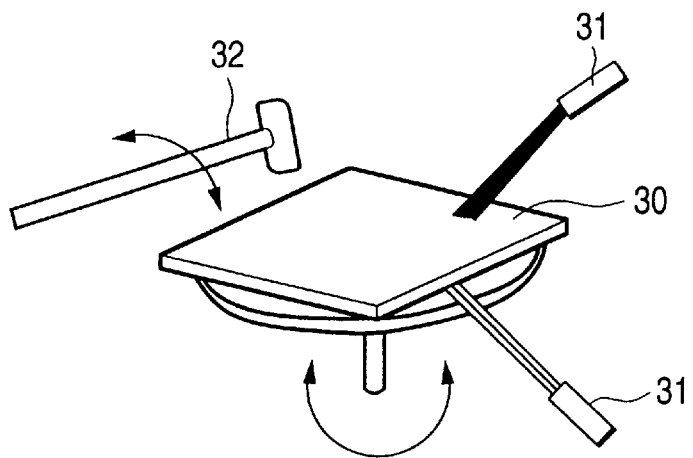
FIG. 9 is a diagram illustrating a process for cleaning a photomask which rotates horizontally.

An example of the process for pouring a cleaning fluid such as anodic water, cathodic water and low concentration aqueous ammonia onto the surface of the photomask in the various baths is shown in FIG. 9.

As shown in FIG. 9, onto the surface of a photomask substrate 30 which rotates horizontally is poured anodic water, cathodic water or cathodic water added with a slight amount of an aqueous ammonia i from a nozzle 31 fixed within a cleaning chamber or a nozzle fixed on a swinging arm 32. In this manner, effective cleaning can be effected.

Figure 10:
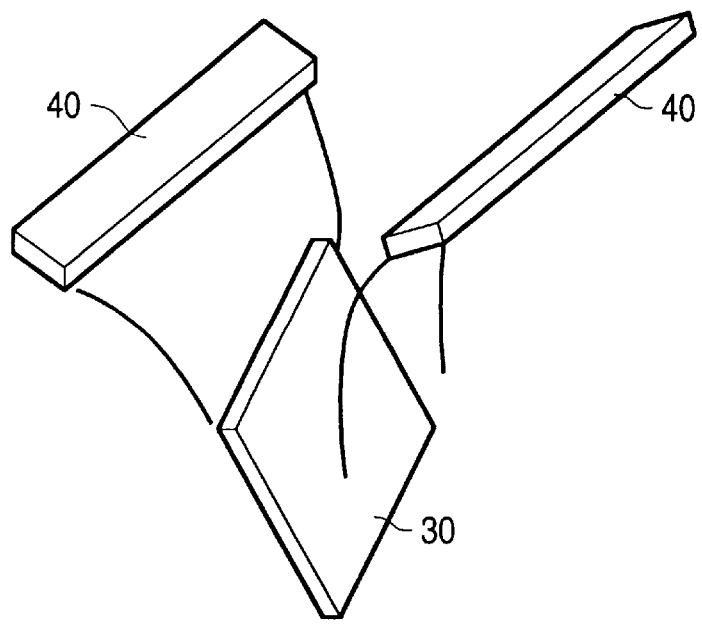
FIG. 10 is a diagram illustrating a process for cleaning a photomask using a linear megasonic nozzle.
Figure 11:
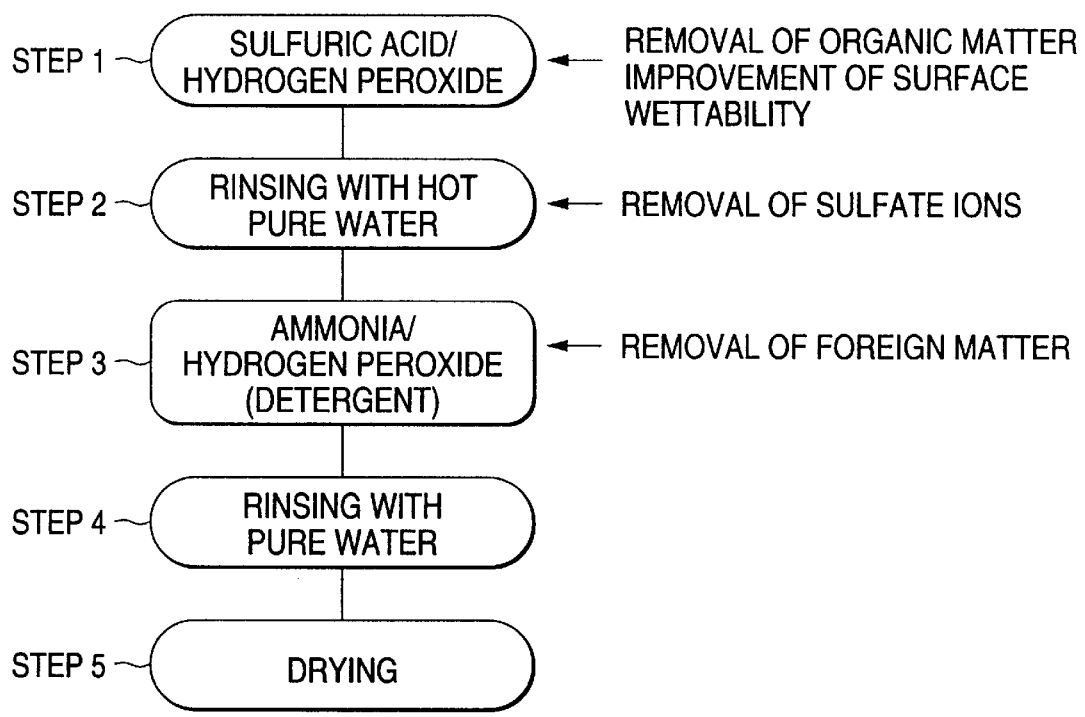
FIG. 11 is a diagram illustrating the entire steps of a conventional process for cleaning a photomask.
Figure 12A:
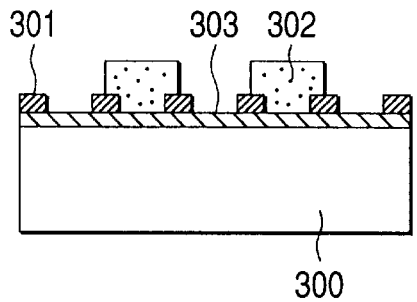
FIGS. 12A–12D represent phase shift photomask.
Figure 12B:
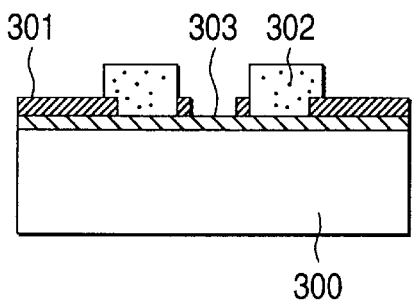
Figure 12C:
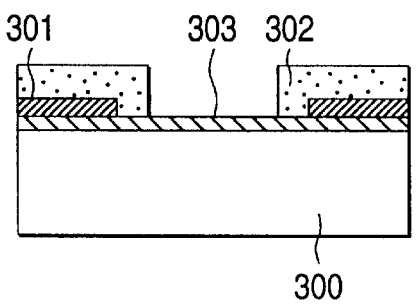
Figure 12D:
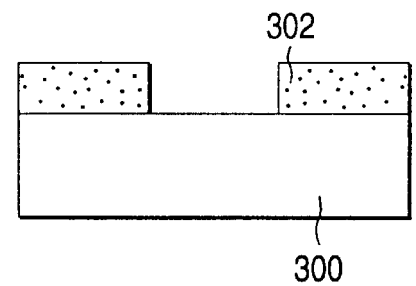

Alternatively, as shown in FIG. 10, cleaning combined with megasonic treatment can be effected. More specifically, a photomask substrate 30 is rinsed with anodic water, cathodic water or cathodic water added with a slight amount of an aqueous ammonia to which megasonic wave has been applied from a linear megasonic nozzle 40 within the various cleaning baths.

Rinsing with anodic water to which megasonic wave has been applied from a megasonic wave oscillating nozzle fixed to the swinging arm 32 shown in FIG. 9 can exert similar effects.

Alternatively, if only pure water to which megasonic wave has been applied from this megasonic nozzle is poured onto the photomask substrate while an aqueous ammonia, a mixture of aqueous ammonia/hydrogen peroxide, cathodic water, cathodic water added with a slight amount of an aqueous ammonia or the like from another nozzle is being poured thereonto, foreign objects can be removed effectively.

In order to use different baths depending on the kind of the photomask to be treated, each kind of baths may consist of a plurality of baths.

Further, the cleaning fluid to be supplied into the various cleaning baths by the control portion 200 can be heated by a heating device such as in-line heater.

The drying bath 105 is connected to a unit which performs drying with a vapor of alcohol such as IPA (isopropyl alcohol), spin drying involving high speed horizontal rotation of photomask or other drying methods.

FIG. 8 illustrates an apparatus in which the drying bath 105 is connected to IPA (ispropyl alcohol) unit 204.

In the case where a spin drying unit is provided, IPA unit 204 is omitted.

The photomask thus dried is carried to the receiver unit where it is then housed in a specified case, etc.

As mentioned above, the cleaning fluid to be used in the various cleaning baths is supplied from the various cleaning fluid supply units (acid preparation tank 201, alkali/cleaning fluid preparation tank 202, electrolytic water production unit 203) of the cleaning fluid supply/control portion 200, which is provided independently of the main body.

The control unit 205 such as sequencer for optimally controlling the operation of the apparatus is provided for these cleaning fluid supply units.

The photomask thus dried is carried to the receiver unit where it is then housed in a specified case.

Although in said embodiments method of cleaning photomask having a light shielding pattern of CrON film and phase shift photomask having a semi transparent pattern of MoSiON film is shown, the method of the present invention is applicable to Levenson type of phase shift photomask, Sub Pattern type of phase shift photomask, and edge empathizing type of phase shift photomask as shown in FIGS. 12A–12D, and is also applicable to the photomask after each of phase shifter pattern, light shielding pattern forming steps and laser trimming step.

The method of cleaning a photomask according to the present invention comprises a first step of cleaning the surface of a photomask used as a master in the photolithography step in the process for the production of semiconductor device with a hot mixture of sulfuric acid and hydrogen peroxide to decompose organic objects present thereon and remove metallic impurities, a second step of removing residual sulfuric acid from the surface of said photomask, a third step of removing foreign objects attached to the surface of said photomask, and a fourth step of drying said photomask which has gone through said first, second and third steps, characterized in that said second step involves the removal of residual sulfuric acid from the surface of said photomask with anodic water. Accordingly, the anodic water, even if it is used at room temperature (25° C.), is capable of removing residual sulfuric acid to the same or higher extent as compared with the conventional hot pure water. This eliminates the necessity of heating the anodic water as a cleaning fluid as in the conventional cleaning methods, making it possible to reduce the consumption of electric energy.

In the method of cleaning a photomask according to the present invention, the anodic water to be used at the second step is warmed to a temperature of not lower than 30° C. Thus, the cleaning effect for the removal of residual sulfuric acid can be further enhanced. Further, the resulting enhanced cleaning effect makes it possible to reduce the required amount of cleaning fluid, pure water or the like.

In the method of cleaning a photomask according to the present invention, the third step involves the removal of foreign objects with cathodic water. Thus, foreign objects can be removed even from the surface of a phase shift photomask comprising an MoSiON film formed thereon as a light-shielding layer without impairing the transmission of the light-shielding layer.

In the method of cleaning a photomask according to the present invention, the cathodic water to be used at the third step contain a slight amount of ammonia. Thus, foreign objects can be removed more effectively even from the surface of a phase shift photomask comprising an MoSiON film formed thereon as a light-shielding layer. Further, the required amount of cleaning fluid, pure water or the like can be reduced.

In the method of cleaning a photomask according to the present invention, at least one of the first to third steps involves ultrasonic treatment as well. Thus, the cleaning effect can be enhanced.

The apparatus for cleaning a photomask according to the present invention comprises an acid tank for cleaning the surface of a photomask used as a master in the photolithography step in the process for the production of semiconductor device with a hot mixture of sulfuric acid and hydrogen peroxide to decompose organic objects present thereon and remove metallic impurities, a rinsing tank for cleaning the surface of said photomask with anodic water produced in electrolytic water production unit, a foreign object removal tank for cleaning the surface of said photomask with cathodic water produced in said electrolytic water production unit, a drying tank for drying said photomask thus cleaned, and a cleaning fluid supplying/controlling means for controlling the respective cleaning fluid to be supplied into said acid tank, rinsing tank and foreign object removal tank within a predetermined concentration or temperature. Accordingly, the anodic water as a cleaning water to be used for the removal of residual sulfuric acid from the surface of a photomask exhibits a high cleaning capacity even at room temperature and thus doesn't need to be heated to high temperatures, making it possible to reduce the consumption of electric energy.

Further, since cathodic water is used to remove foreign objects, foreign objects can be removed even from the surface of a phase shift photomask comprising an MoSiON film formed thereon as a light-shielding layer without impairing the transmission of the light-shielding layer.

In the apparatus for cleaning a photomask according to the present invention, at least one of the acid tank, rinsing tank and foreign object removal tank is capable of ultrasonic treatment as well. Thus, the cleaning effect can be further enhanced.

In the apparatus for cleaning a photomask according to the present invention, the anodic water to be used in the rinsing tank is heated to a temperature of not lower than 30° C. Thus, the cleaning effect for the removal of residual sulfuric acid can be further enhanced. Further, the resulting enhanced cleaning effect makes it possible to reduce the required amount of cleaning fluid, pure water or the like.

In the apparatus for cleaning a photomask according to the present invention, a means of supplying an aqueous ammonia with a predetermined concentration into the foreign object removal tank is provided and the cathodic water to be used in the foreign object removal tank contains a slight amount of ammonia. Thus, foreign objects can be removed more effectively even from the surface of a phase shift photomask comprising an MoSiON film formed thereon as a light-shielding layer. Further, the required amount of cleaning fluid, pure water or the like can be reduced.

What is claimed is:

1. An apparatus for cleaning a photomask comprising:

an acid tank for cleaning the surface of a photomask used as a master in a photolithography step in a process for the production of a semiconductor device with a hot mixture of sulfuric acid and hydrogen peroxide to decompose organic objects present thereon and remove metallic impurities;

a electrolytic water production unit;

a rinsing tank for cleaning the surface of said photomask with anodic water produced in the electrolytic water production unit;

a foreign object removal tank for cleaning the surface of said photomask with cathodic water produced in said electrolytic water production unit;

a drying tank for drying said photomask thus cleaned; and a cleaning fluid supplying/controlling means for controlling the respective cleaning fluid to be supplied into said acid tank, rinsing tank and foreign object removal tank within a predetermined concentration or temperature.

2. The apparatus for cleaning a photomask according to claim 1, wherein at least one of said acid tank, rinsing tank and foreign object removal tank is capable of ultrasonic treatment as well.

3. The apparatus for cleaning a photomask according to claim 1, wherein said anodic water to be used in said rinsing tank is heated to a temperature of not lower than 30° C.

4. The apparatus for cleaning a photomask according to claim 1, wherein a means of supplying an aqueous ammonia with a predetermined concentration into said foreign object removal tank is provided and said cathodic water to be used in said foreign object removal tank contains a slight amount of ammonia.

* * * * *